(12) United States Patent  (10) Patent No.: US 6,719,570 B2
Tsuchioka  (45) Date of Patent: Apr. 13, 2004

(54) CARD-TYPE PORTABLE DEVICE

(75) Inventor: Mitsuhiro Tsuchioka, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/152,285

(22) Filed: May 22, 2002

(65) Prior Publication Data

US 2002/0177335 A1 Nov. 28, 2002

(30) Foreign Application Priority Data

May 22, 2001 (JP) ........................................ 2001-152792
Apr. 22, 2002 (JP) ........................................ 2002-119397

(51) Int. Cl.⁷ .............................................. H01R 12/00
(52) U.S. Cl. ...................... 439/76.1; 439/951; 439/638; 361/737; 235/492
(58) Field of Search ................................ 439/951, 945, 439/946, 638, 76.1; 361/737; 235/492

(56) References Cited

U.S. PATENT DOCUMENTS 3,396,461 A * 8/1968 Spooner et al. ............... 29/827
3,668,476 A * 6/1972 Wrabel et al. ............... 361/785
3,765,076 A * 10/1973 Brandt ........................ 29/860
4,303,291 A * 12/1981 Dines ......................... 29/843
5,040,993 A * 8/1991 Krug et al. .................... 439/75
5,502,620 A * 3/1996 Funck et al. ................. 361/753
6,132,223 A * 10/2000 Seeley et al. ............... 439/76.1
6,272,017 B1 * 8/2001 Klatt et al. .................. 361/737
6,381,143 B1 * 4/2002 Nakamura ................... 367/737
6,634,561 B1 * 10/2003 Wallace ....................... 235/492

* cited by examiner

*Primary Examiner*—Truc Nguyen
(74) *Attorney, Agent, or Firm*—Keating & Bennett, LLP

(57) ABSTRACT

In a card-type portable device, a terminal board is provided in the terminal board mounting area of a circuit board. Terminal electrodes are provided on a surface of the terminal board. The terminal electrodes are arranged at a height position according to a device specification by setting the thickness of the terminal board such that the terminal electrodes are positioned at the specified height position even when the height position of the circuit board is freely set. Also, by placing the circuit board along the wall of the bottom of a casing, the space defined by the circuit board and the upper wall of the casing is increased. Accordingly, tall electronic components can be provided on the circuit board in the casing, while maintaining the specified thickness of the casing.

12 Claims, 10 Drawing Sheets

CARD-TYPE PORTABLE DEVICE

BACKGROUND OF THE INVENTION

1. Field of the Invention

The present invention relates to a card-type portable device, for use in, for example, various electronic devices such as a personal computer and a digital camera.

2. Description of the Related Art

In recent years, multimedia cards and SD memory cards using flash memory have been used as storage media for storing a large amount of data in digital video cameras, digital cameras, mobile terminals, and other electronic devices. Each of these cards is inserted into a card insertion slot of a digital video camera or other electronic device, and after data is stored on the card, the card can be loaded, for example, in a personal computer such that data may be edited.

Also, a communication card having a radio communication function may be necessary in order to receive data distribution of music from a base station of a mobile phone (for example, a personal handyphone system (PHS)) to a mobile terminal such as a personal digital assistants (personal data assistants) (PDA). The external dimensions and electrical characteristics of a serial connection of this communication card correspond to those of, for example, an SD card. Particularly, in terminal electrodes which mechanically contact the inside of the card insertion slot, the number of terminal electrodes, the alignment pattern, and the distance from the card surface to the terminal electrodes are specified.

In order to fulfill these specifications, a circuit board 1 is provided in the center of a casing 2 in the communication card, as shown in the sectional view of FIG. 16. That is, the circuit board 1 is provided in the casing 2 with an end surface thereof being exposed. The location of the circuit board 1 is set such that the end surface of the circuit board 1 is located lower than the outer surface 3 of the casing 2 by the height h. On the exposed end surface 4 of the circuit board 1, eight terminal electrodes 5 are aligned along a line in the width direction of the circuit board 1, as shown in the plan view of FIG. 17. One terminal electrode 6 is arranged offset backwardly from the remaining terminal electrodes. Further, inside the casing 2, electronic components 7, such as an interface circuit, a controller, a baseband processing circuit, an IC such as a memory, an RF circuit, and an antenna, are mounted on the both surfaces of the circuit board 1.

However, the thickness of an SD card is specified as 2.1 mm. When the circuit board 1 is provided in the center of the casing 2, tall electronic components 7 cannot be mounted on the circuit board 1 because the space defined by the board surface of the circuit board 1 and the casing 2 is less than the tall electronic components 7. Accordingly, if the tall electronic components 7 are mounted on the circuit board 1, the thickness of the casing 2 of the communication card increases and the communication card does not conform to the specifications.

Further, the communication card is repeatedly inserted into the card insertion slot of equipment such as a PDA and is brought into contact with an internal terminal. Thus, the card is thickly gold-plated in order to decrease the contact resistance of the terminal electrodes 5 and 6 and to increase the durability against mechanical friction. However, by gold-plating the entire conductor portion including the wiring pattern of the circuit board 1, the cost increases. Also, when the above-described electronic components 7 are mounted via solder, gold diffuses in the solder and the strength of the solder connection reduces, which results in reduced reliability of electronic component mounting. Gold-plating may be selectively performed on only the terminal electrodes 5 and 6 provided on the circuit board 1 in order to reduce the amount of gold used, however in that case, the manufacturing process is complicated and the manufacture costs increase.

SUMMARY OF THE INVENTION

In order to overcome the above-described problems, preferred embodiments of the present invention provide a card-type portable device in which the height position of terminal electrodes conforms to the specification of a card-type portable device and the circuit board can be freely arranged inside a casing.

A card-type portable device according to a preferred embodiment of the present invention includes a circuit board for mounting electronic components thereon to define a circuit, a casing for accommodating the circuit board, a portion of the circuit board being exposed from the case, and a terminal board including a surface provided with terminal electrodes. The terminal board is mounted on the circuit board, the terminal electrodes is arranged relative to the exposed portion of the circuit board and the terminal electrodes are arranged at a height location that is different from the height location of the board surface of the circuit board.

The casing includes a pair of walls which face each other with a space therebetween and which are substantially parallel to each other, the circuit board is provided along the inner surface of one of the pair of walls, the terminal electrode surface of the terminal board is arranged so as to be substantially parallel to the surface of the circuit board, and the height position of the terminal electrode surface is set based on the thickness of the terminal board.

The surface of the terminal board includes the plurality of terminal electrodes, the bottom surface of the terminal board includes a plurality of connection electrodes connected to the terminal electrodes of the terminal board, and the terminal board mounting portion of the circuit board includes connection patterns which face and are connected to the connection electrodes of the terminal board.

The terminal electrodes and the connection electrodes of the terminal board are preferably defined by different conductors.

Each of the connection electrodes of the terminal board and each of the connection patterns of the circuit board includes a plurality of connection lands and coupling lands for mutually coupling the connection lands.

The connection electrodes of the terminal board and the connection patterns of the circuit board are covered with resist, the resist is provided with openings in the portions of the connection lands such that the connection lands are exposed, and the connection lands arranged vertically are soldered.

A solder ball is attached to each of the connection lands of the connection electrodes, and the connection lands of the connection electrodes and the connection lands of the connection patterns that face each other are bonded via the solder balls.

The plurality of terminal electrodes and the plurality of connection electrodes provided on the terminal board are aligned, the circuit board is provided with the plurality of connection patterns corresponding to the alignment positions of the connection electrodes, and the width of the terminal board in the alignment direction of the terminal electrodes is greater than the width of the circuit board in the alignment direction of the connection patterns.

The electronic components are mounted on the bottom surface of the terminal board and the terminal board mounting area of the circuit board is provided with recessed portions for mounting the electronic components therein.

The difference between the coefficient of linear expansion in the direction along the board surface of the terminal board and the coefficient of linear expansion in the direction along the board surface of the circuit board is about 26.6 ppm/° C. or less.

The material of the terminal board and the material of the circuit board preferably have the same coefficient of linear expansion in the direction along the board surface.

According to another preferred embodiment of the present invention, the card-type portable device is preferably a communication card having a communication function.

Other feature, elements, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments according to the present invention will be described with reference to the drawings.

Figure 1:
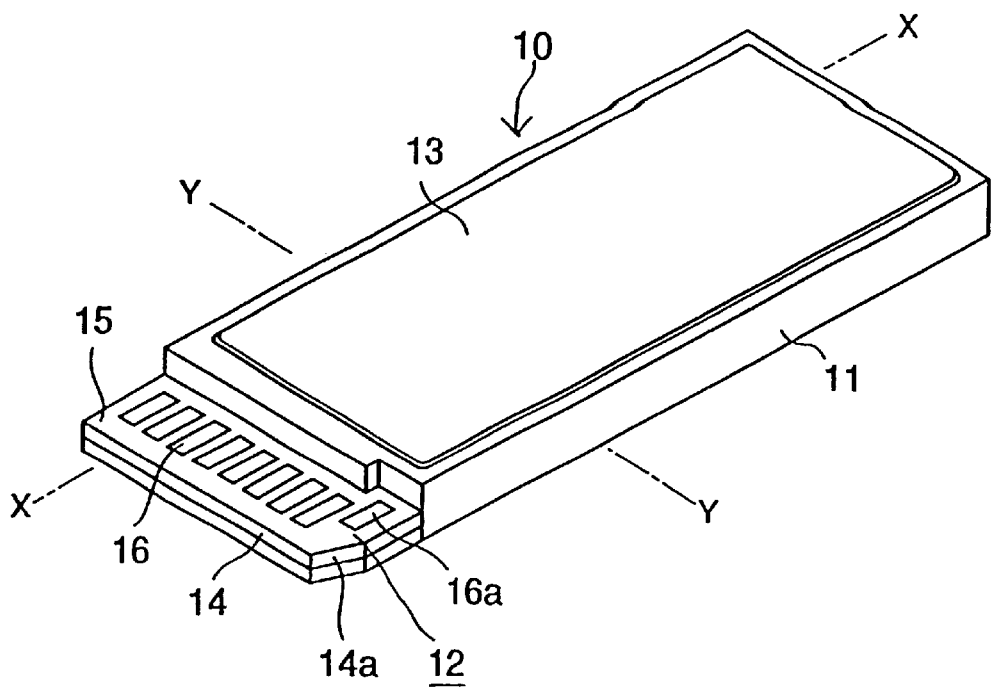
FIG. 1 is a perspective view showing a first preferred embodiment of a card-type portable device according to the present invention.
Figure 2:
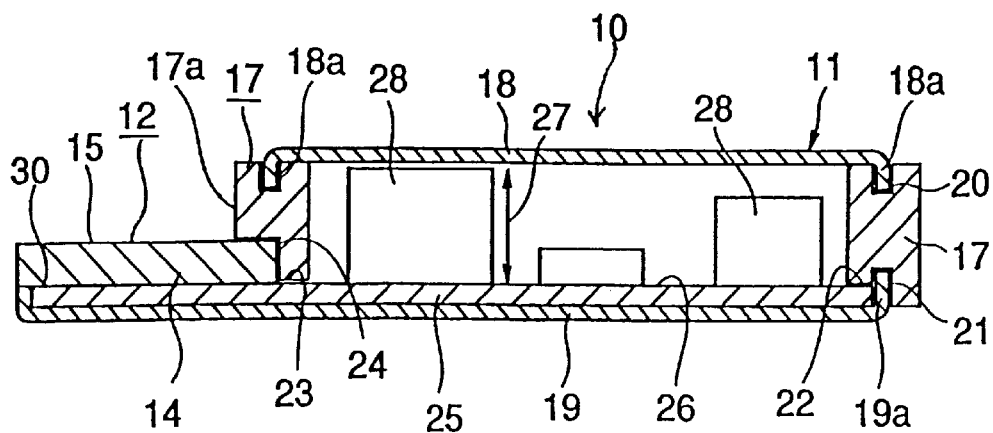
FIG. 2 is a sectional view taken along the long and short dashed line II—II in FIG. 1.

FIG. 1 is a perspective view schematically showing a communication card which is a card-type portable device according to a first preferred embodiment of the present invention. FIG. 2 is a schematic sectional view taken along the II—II line in FIG. 1 and FIG. 3 is a schematic sectional view taken along the III—III line in FIG. 1.

In FIG. 1, a casing 11 of the communication card 10 is thin and preferably has a substantially rectangular shape. Also, a connector portion 12 is provided at one end in the longitudinal direction of the communication card 10. The connector portion 12 is coupled to the connector in the card insertion slot of equipment, such as a personal computer or a PDA, in which the communication card 10 is loaded. In the first preferred embodiment, the connector portion 12 is configured in accordance with the specifications of an SD card. That is, a terminal surface (terminal electrode forming surface) 15 of a terminal board 14 is provided at a height position which is defined based on a surface 13 of the casing 11. Additionally, a plurality of terminal electrodes 16 are substantially aligned along one line in parallel on the terminal surface 15.

Figure 3:
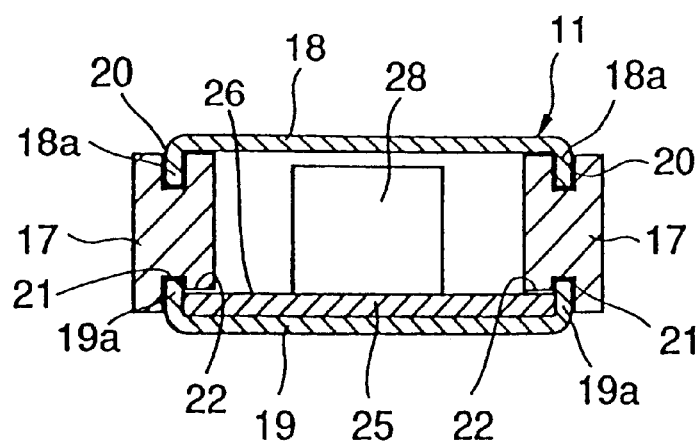
FIG. 3 is a sectional view taken along the long and short dashed line III—III in FIG. 1.

The casing 11 of the communication card 10 includes a frame 17 defining the outline of the casing 11 and an upper cover 18 and a lower cover 19 defining the upper and lower outer surfaces of the casing 11, as shown in FIGS. 2 and 3. The frame 17 includes four thick wall members preferably made of plastic, resin, or metal, which are arranged in a square and define the side wall of the casing 11.

The upper portion of the frame 17 is provided with a fitting groove 20 which extends along the edge thereof. Additionally, the lower portion of the frame 17 is provided with a fitting groove 21 which extends along the edge thereof, except a wall member 17a portion on the connector portion 12 side. In addition, a shelf-like portion 22 having a depth which is substantially equal to the thickness of the circuit board 25 is provided in a lower inner portion of the frame 17. Further, in a lower portion of the wall member 17a of the frame 17 on the connector portion 12 side, a contact portion 23 which contacts a surface 26 of the circuit board 25 is provided and is flush with the shelf-like portion 22. Further, a stepped portion 24 to which the terminal board 14 is fitted is provided in a lower outer portion of the wall member 17a on the connector portion 12 side.

Each of the upper cover 18 and the lower cover 19 includes a metal or plastic thin plate having edge portions 18a and 19a which are bent at substantially a right angle. By fitting these edge portions 18a and 19a into the fitting grooves 20 and 21 of the frame 17, respectively, the upper cover 18 and the lower cover 19 are fitted to the frame 17. The upper cover 18 and the lower cover 19 face each other with a space therebetween and define walls which are substantially parallel to each other in the casing 11.

In the first preferred embodiment, the circuit board 25 is bonded on the lower cover 19 with an adhesive or other suitable bonding material. One end portion of the circuit board 25 is exposed outside the wall member 17a of the frame 17 on the connector portion 12 side. The other end portion of the circuit board 25 is arranged in the space between the shelf-like portion 22 in the lower inner portion of the frame 17 and the lower cover 19.

With this configuration, a space 27 defined by the surface 26 of the circuit board 25 and the inner surface of the upper cover 18 has a uniform height inside the casing 11. In the first preferred embodiment, the circuit board 25 is preferably a monolayer or multilayer circuit board on which a wiring pattern including copper is provided. The space 27 enables electronic components 28, such as an interface circuit, a controller, a baseband processing circuit, an RF circuit, and antenna, to be mounted on the surface 26 of the circuit board 25 inside the casing 11.

On an end surface 30 of the circuit board 25 which is exposed outside the frame 17, the terminal board 14 is mounted such that a portion thereof is arranged in the stepped portion 24 provided in the wall member 17a of the frame 17. The thickness of the terminal board 14 is set such that the terminal surface 15 is positioned at a height position defined by the outer surface of the upper cover 18 or the lower cover 19.

Figure 4A:
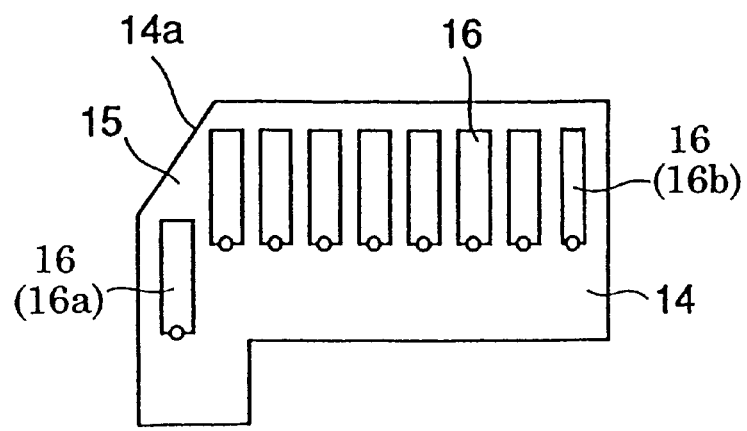
FIGS. 4A and 4B show an example of a terminal board of the card-type portable device according to the first preferred embodiment and FIG. 4A shows the front side and FIG. 4B shows the bottom side.

Also, as shown in FIG. 4A, the left end portion of the terminal board 14 is sloped. One terminal electrode 16a is placed in a sloped portion 14a of the terminal surface 15 so as to be offset from the other terminal electrodes 16. Further, among the aligned terminal electrodes 16, a terminal electrode 16b at the right end has a width less than that of the other terminal electrodes 16. The width of each of the terminal electrodes 16 and the interval between the terminal electrodes 16 are set according to a predetermined specification.

Figure 4B:
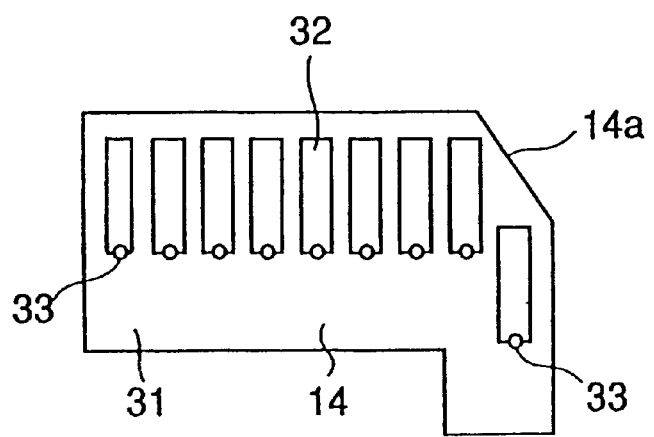

As shown in FIG. 4B, the bottom surface 31 of the terminal board 14 is provided with a plurality of connection electrodes 32, each connection electrode 32 is connected to a respective one of the terminal electrodes 16 on the surface (terminal surface) 15 via through holes 33. These connection electrodes 32 have substantially the same shape as that of the terminal electrodes 16 and are aligned so as to face the terminal electrodes 16.

In the first preferred embodiment, the terminal electrodes 16 are preferably nickel-plated over the copper pattern, and the nickel layer is thickly gold-plated. Additionally, the connection electrodes 32 are preferably made of metal, such as copper and copper alloy to facilitate soldering with the circuit board 25, and the through-holes 33 are filled with resin.

Figure 5:
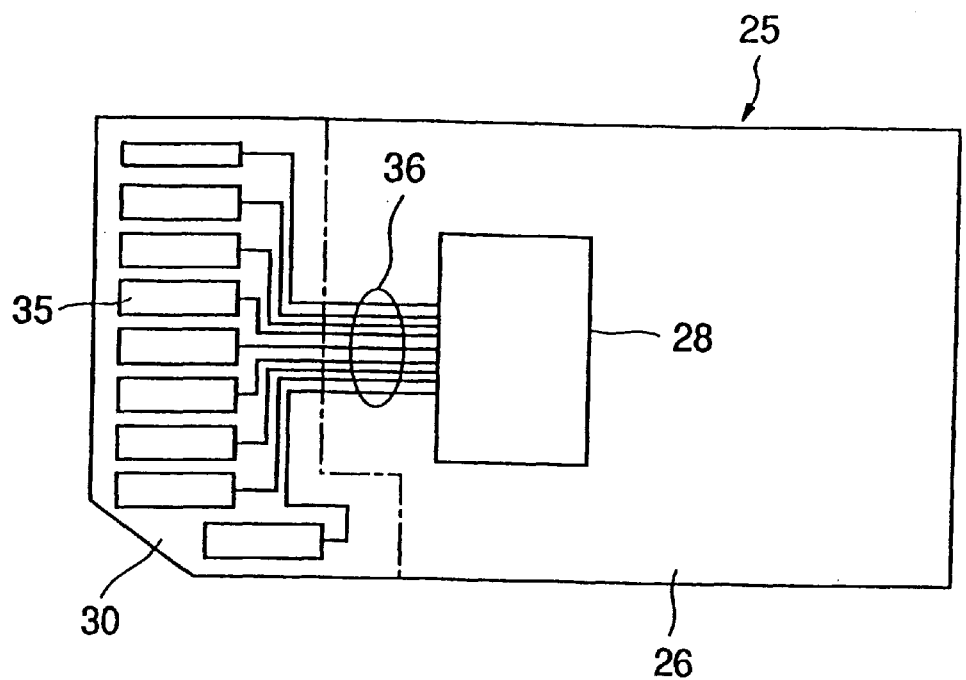
FIG. 5 is a simplified plan view of a circuit board of the card-type portable device according to the first preferred embodiment of the present invention.

Also, as shown in FIG. 5, a plurality of connection patterns 35 are aligned on the exposed end surface 30 of the circuit board 25. These connection patterns 35 have substantially the same shape and are aligned with those of the connection electrodes 32 of the terminal board 14. Also, each of the connection patterns 35 faces and is connected to each of the connection electrodes 32, respectively. These connection patterns 35 are connected, for example, to the interface circuit 28 via wiring patterns 36 provided on the circuit board 25.

The terminal board 14 is mounted on the exposed end surface 30 of the circuit board 25 on which the connection patterns 35 are provided, such that each of the connection electrodes 32 on the bottom side of the terminal board 14 is bonded to a corresponding connection pattern 35 of the circuit board 25. When the terminal board 14 is mounted on the circuit board 25, a soldering flux (for example, a water-soluble heat-resistant flux) is applied on the bottom surface 31 of the terminal board 14, over the connection electrodes 32. on the other hand, a soldering flux is applied on the exposed end surface 30 of the circuit board 25 over the connection patterns 35 and the wiring patterns 36 in advance, and furthermore, a solder is also applied. The terminal board 14 is superimposed on the exposed end surface 30 of the circuit board 35, such that the connection electrodes 32 and the connection patterns 35 face each other, and placed in a reflow atmosphere, whereby strong soldering between the connection electrodes 32 and the connection patterns 35 is achieved.

In the first preferred embodiment, the circuit board 25 and the terminal board 14 are preferably made of the same material. Additionally, the coefficient of linear expansion in the direction along the board surface of the circuit board 25 is preferably the same as the coefficient of linear expansion in the direction along the board surface of the terminal board 14. Accordingly, in a cooling process after a reflow process for bonding the terminal board 14 and the circuit board 25, the terminal board 14 and the circuit board 25 shrink with substantially the same shrinkage ratio. If the shrinkage ratio of the terminal board 14 is different from that of the circuit board 25, one of the terminal board 14 and the circuit board 25, which are soldered, shrinks more than the other. As a result, the soldered terminal board 14 and the circuit board 25 warp. On the other hand, in the first preferred embodiment, since the terminal board 14 and the circuit board 25 shrink with substantially the same shrinkage ratio, warping of the soldered terminal board 14 and the circuit board 25 resulted from the difference in the shrinkage ratio is prevented. Accordingly, a flat terminal surface 15 of the terminal board 14 is obtained.

In the first preferred embodiment, the terminal electrodes 16 are provided on the terminal board 14 that is separate from the circuit board 25. Thus, the terminal electrodes 16 can be placed in the specified height position by appropriately setting the thickness of the terminal board 14, even when the height position of the circuit board 25 is freely set. In other words, the height position of the circuit board 25 can be freely set without being restricted by the specified height position of the terminal electrodes 16, and thus, tall electronic components 28 are easily mounted on the circuit board 25.

Figure 6:
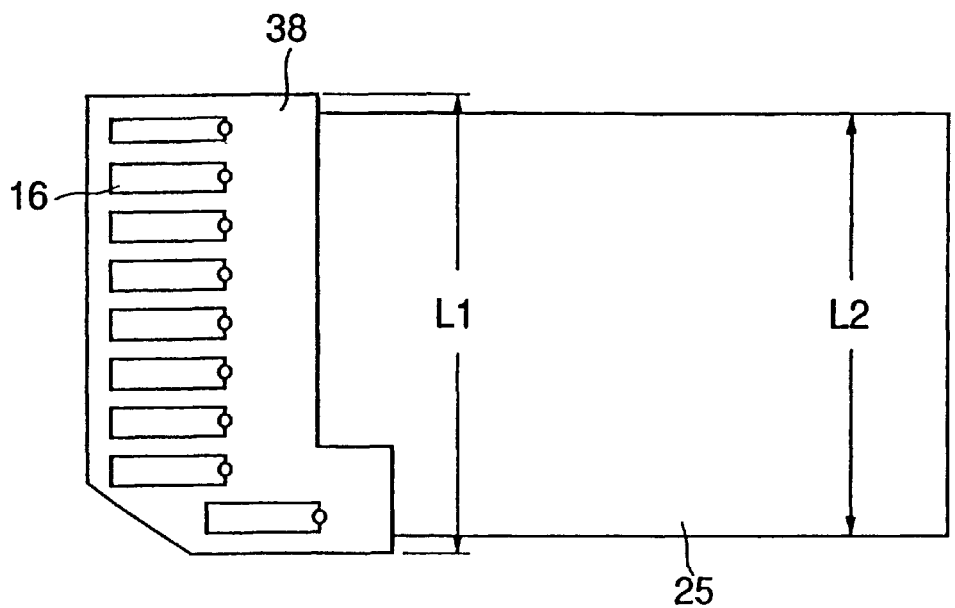
FIG. 6 is a plan view showing another preferred embodiment of the terminal board in the card-type portable device of the present invention.

Incidentally, in the first preferred embodiment, the width of the terminal board 14 is the same as that of the circuit board 25. However, as shown in FIG. 6, the width L1 of the terminal board 38 in the alignment direction of the terminal electrodes 16 can be wider than the width L2 of the circuit board 25 in the alignment direction of the connection patterns 35 because the terminal board 14 is prepared separately from the circuit board 25. Furthermore, the width of the circuit board 25 may be reduced without changing the size of the terminal board 38.

Although gold is preferably used in the terminal electrodes 16 in the first preferred embodiment, other metals such as beryllium can be used if the durability against contact resistance and mechanical friction is obtained. Also, the connection electrodes 32 provided on the bottom surface 31 of the terminal board 14 may be gold-plated in the same method as in the terminal electrodes 16. In this case, a pre-flux process for the terminal board 14 is not necessary.

Hereinafter, a second preferred embodiment of the present invention will be described. In the description of the second preferred embodiment, components which are the same as those in the first preferred embodiment are denoted by the same reference numerals and a duplicate description of common components will be omitted.

Figure 7:
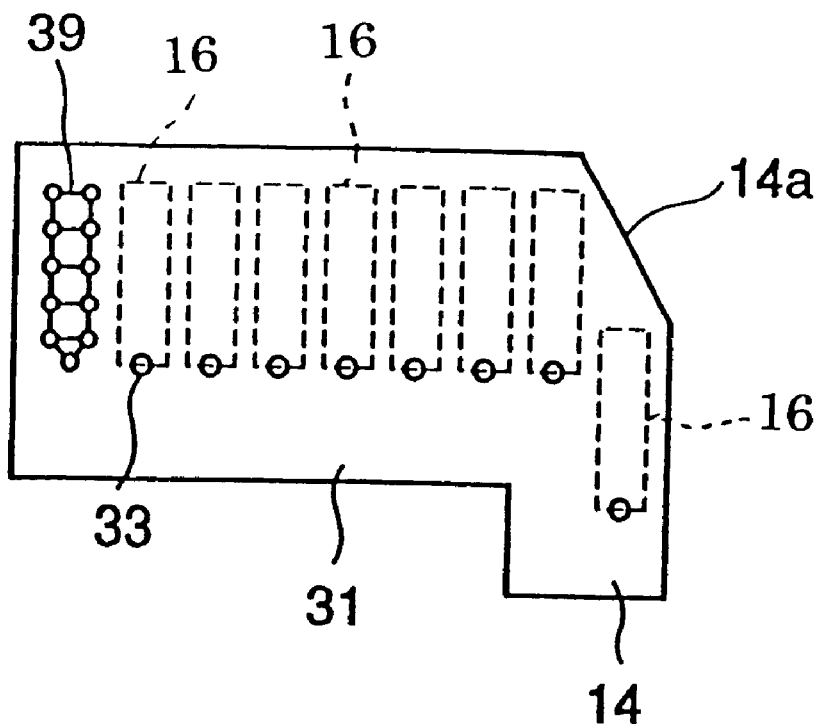
FIG. 7 is a plan view showing the bottom side of the terminal board of a card-type portable device according to a second preferred embodiment of the present invention.
Figure 8:
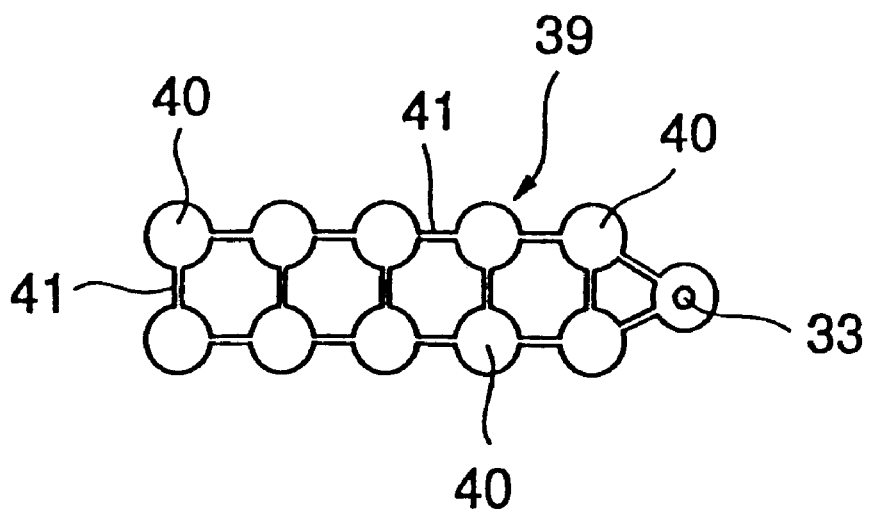
FIG. 8 illustrates the configuration of a connection electrode in FIG. 7.

In the second preferred embodiment, as shown in FIG. 7, connection electrodes 39 are arranged in an array on the bottom surface 31 of the terminal board 14. Each of the array-type connection electrodes 39 includes a plurality of connection lands 40 and coupling lands 41, as shown in FIG. 8. In this figure, the plurality of connection lands 40 are aligned along two lines and the coupling lands 41 couple the connection lands 40 which are adjacent to each other in a row direction and a column direction.

In FIG. 7, only one array-type connection electrode 39 is shown. However, in the second preferred embodiment, a plurality of array-type connection electrodes 39 are provided corresponding to the alignment positions of the terminal electrodes 16 on the terminal surface 15, in the same manner as the connection electrodes 32 in the first preferred embodiment. Also, each of the connection lands 39 is electrically connected to the corresponding terminal electrode 16 on the terminal surface 15 via each of the through-holes 33.

Figure 9:
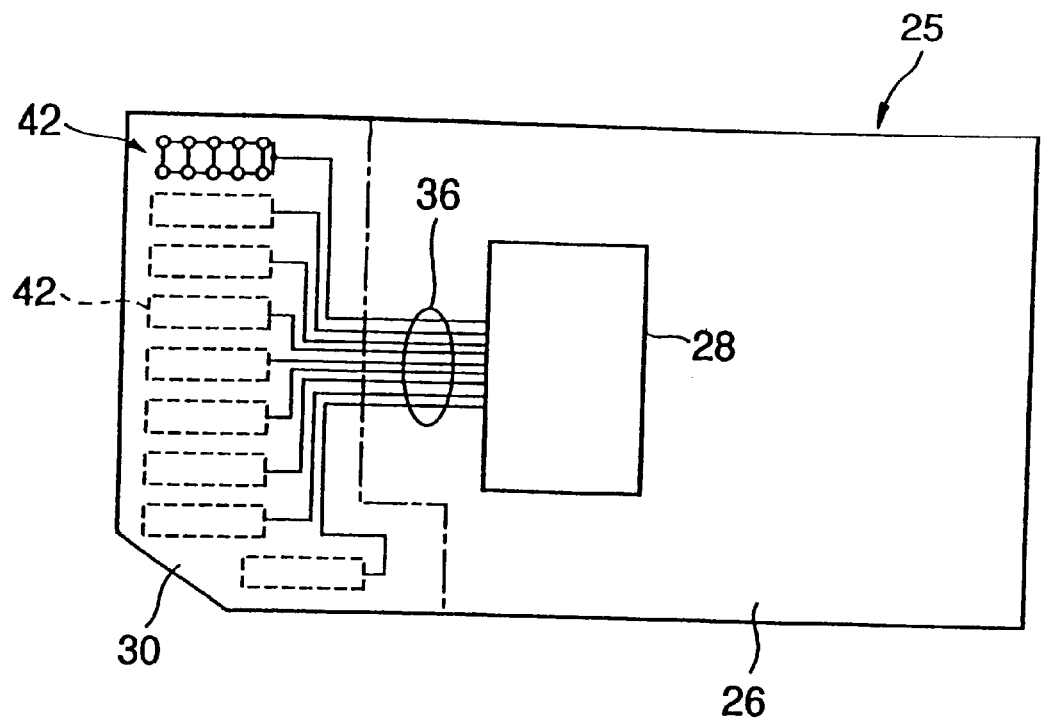
FIG. 9 is a plan view for illustrating the circuit board in the card-type portable device according to the second preferred embodiment of the present invention.
Figure 10:
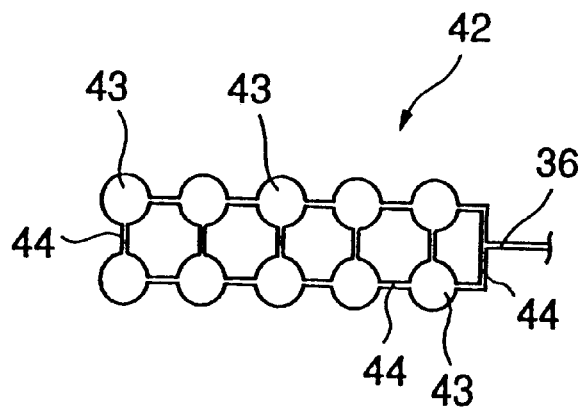
FIG. 10 illustrates the configuration of a connection pattern in FIG. 9.

In the second preferred embodiment, as shown in FIG. 9, the connection patterns 42 are arranged in an array on the exposed end surface 30 of the circuit board 25 as in the connection electrodes 39. That is, each of the connection patterns 42 includes a plurality of aligned connection lands 43 and coupling lands 44 for coupling the connection lands 43, as shown in FIG. 10.

In the second preferred embodiment, the plurality of array-type connection patterns 42 are arranged to correspond to the alignment positions of the connection electrodes 39 and are aligned on the exposed end surface 30 of the circuit board 25. In addition, each of the connection lands 43 of the connection patterns 42 is arranged so as to face each of the connection lands 40 of the connection electrodes 39 of the terminal board 14. The plurality of connection patterns 42 are connected, for example, to the interface circuit 28 on the circuit board 25 via the wiring patterns 36.

The terminal board 14 is mounted on the exposed end surface 30 of the circuit board 25 preferably by soldering each of the connection lands 40 of the connection electrodes 39 on the bottom surface of the terminal board 14 to the corresponding connection land 43 of the connection patterns 42 of the circuit board 25. The connection lands 40 of the terminal board 14 and the connection lands 43 of the circuit board 25 are coupled in the following manner.

Figure 11:
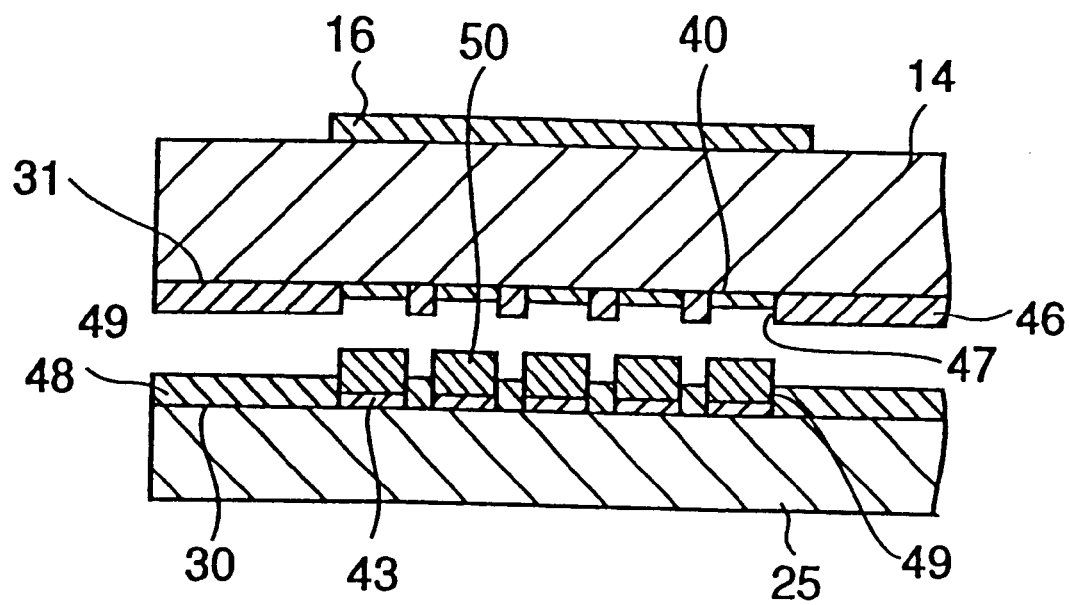
FIG. 11 is a partial sectional view for illustrating a method for coupling the terminal board and the circuit board.

For example, in FIG. 11, the bottom surface 31 of the terminal board 14 is covered with a resist 46 over the connection electrodes 39. In the resist 46, substantially circular openings 47 are provided at portions corresponding to the connection lands 40 such that the surface of each of the connection lands 40 is exposed from each of the openings 47. In other words, the plurality of openings 47 are provided in the resist 46 in a grid pattern for one connection electrode 39 such that the surfaces of all the connection lands 40 are exposed.

On the exposed end surface 30 of the circuit board 25, a resist 48 is arranged over the connection patterns 42 in the same manner as described above and openings 49 for exposing the surface of each connection land 43 are provided in the resist 48. Solder 50 is provided on each of the connection lands 43 exposed from the openings 49.

By applying a soldering flux on the bottom surface 31 of the terminal board 14, superimposing the terminal board 14 on the circuit board 25, and then passing it through a reflow furnace, the connection lands 40 of the terminal board 14 and the connection lands 43 of the circuit board 25 are soldered. Accordingly, the bottom surface 31 of the terminal board 14 and the exposed end surface 30 of the circuit board 25 are securely bonded. As a result, warping of the terminal board 14 caused by forming the terminal electrodes 16 is prevented and a flat terminal surface 15 is achieved.

Even if the relative positions of the connection lands 40 of the terminal board 14 and the connection lands 43 of the circuit board 25 are slightly offset from one another when the terminal board 14 is mounted on the circuit board 25, the terminal board 14 is accurately fixed to the desired position of the circuit board 25, because a self-alignment function is provided by the grid alignment configuration of the connection lands 40 and 43 and the surface tension of the solder when reflow is performed.

Further, even if a bad connection is provided between some of the connection lands 40 and 43 in the connection electrodes 39 and the connection patterns 42 positioned vertically after the reflow, the connection between the other connection lands 40 and 43 is achieved. Thus, the connection electrodes 39 and the connection patterns 42 are electrically connected and bad connection is prevented. Incidentally, the connection lands 40 of the terminal board 14 include metal such as copper or copper alloy to facilitate soldering. The surface of the connection lands 40 may be gold-plated.

Figure 12:
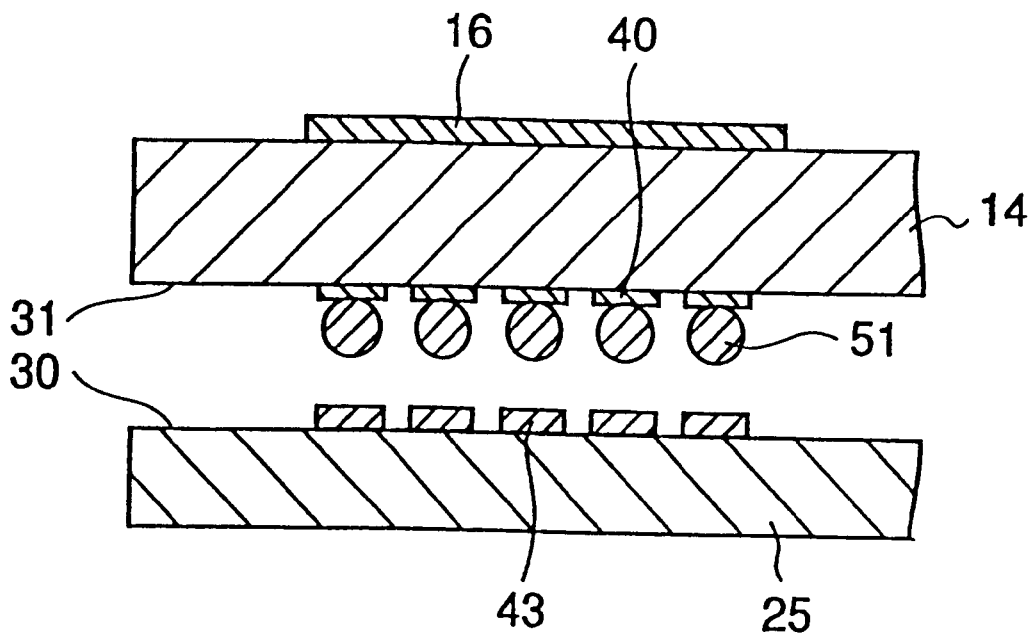
FIG. 12 is a partial sectional view for illustrating another method for coupling the terminal board and the circuit board.

The connection lands 40 of the terminal board 14 and the connection lands 43 of the circuit board 25 may also be coupled in the following way. For example, as shown in FIG. 12, a solder ball 51 is attached to each of the connection lands 40 of the terminal board 14. In other words, a plurality of solder balls 51 are provided in a grid pattern for each connection electrode 39. The exposed end surface 30 of the circuit board 25 is covered with a soldering flux over the connection patterns 42 and the wiring patterns 36.

By superimposing the terminal board 14 on the circuit board 25 and being passed through a reflow furnace, the solder balls 51 melt and the connection lands 40 of the terminal board 14 are soldered to the connection lands 43 of the circuit board 25. In this case, a self-alignment function is provided as in the above-described case and high positioning accuracy for mounting the terminal board 14 on the circuit board 25 is easily obtained.

In the second preferred embodiment, since the connection lands 43 include copper and the solder balls 51 contact the connection lands 43, a preferable wettability of solder is obtained and a sufficient bonding strength is obtained after the soldering. As a result, the reliability of terminal board mounting is ensured. Thus, an underfill material is not required for increasing the bonding strength between the terminal board 14 and thus, the circuit board 25, and the manufacturing costs are greatly reduced.

Hereinafter, a third preferred embodiment of the present invention will be described. In the description of the third preferred embodiment, components which are the same as those in the first and second preferred embodiments are denoted by the same reference numerals and a duplicate description of common components is omitted.

Figure 13:
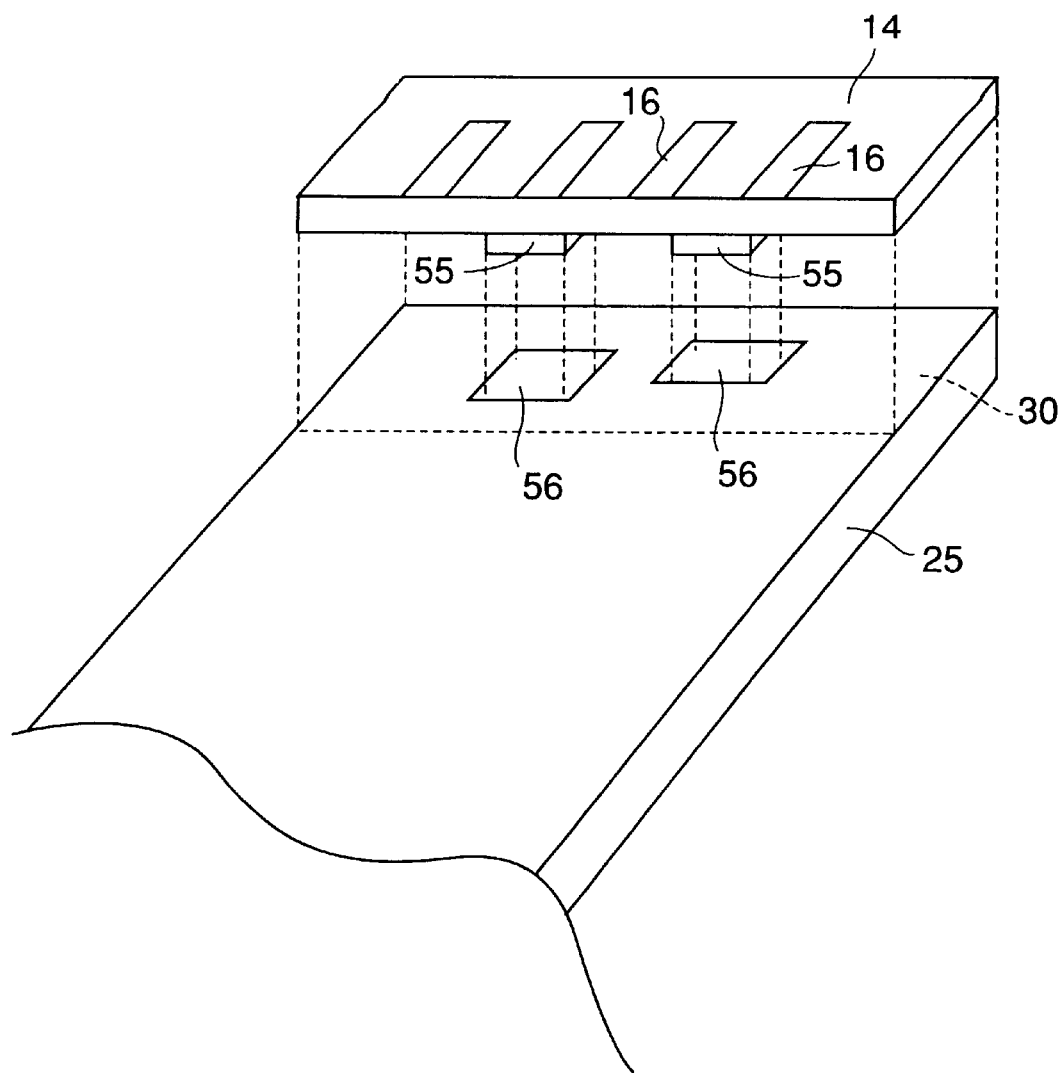
FIG. 13 is a perspective view showing a third preferred embodiment of a card-type portable device according to the present invention.

In FIG. 13, the third preferred embodiment is shown by a simplified schematic model view. As shown in FIG. 13, in the third preferred embodiment, electronic components 55 are mounted on the bottom surface of the terminal board 14. Also, the connection electrodes 32 (39) are provided on the bottom surface of the terminal board 14, in areas other than the formation area of the electronic components 55.

In the third preferred embodiment, the electronic components 55 are electronic components for removing a disturbance noise (for example, chip components such as a bypass capacitor and a filter). For example, the electronic components 55 are provided in conduction paths for connecting the terminal electrodes 16 on the surface of the terminal board 14 and the connection electrodes 32 (39) on the bottom surface of the terminal board 14. The electronic components 55 for removing a disturbance noise prevent external noise from entering the circuit board 25. Accordingly, the stability of the operation of the communication card is greatly improved.

On the terminal board mounting area 30 of the circuit board 25, hole portions 56 are provided for the electronic components, in the areas facing the electronic components 55. Also, on the terminal board mounting area 30 of the circuit board 25, the connection patterns 35 (42) and the wiring patterns 36 which are connected to the connection electrodes 32 (39) of the terminal board 14 are provided. The hole portions 56 may be through-holes which penetrate the circuit board 25 from the top surface to the bottom surface or may be recessed portions which do not completely penetrate the circuit board, in accordance with the height of the electronic components 55.

The remaining configuration is substantially the same as that in the first and second preferred embodiments of the present invention.

Hereinafter, a fourth preferred embodiment of the present invention will be described. In the description of the fourth preferred embodiment, components which are the same as those in the first to third preferred embodiments are denoted by the same reference numerals and a duplicate description of common components are omitted.

In the fourth preferred embodiment, the material of the terminal board 14 is different from that of the circuit board 25. The difference in the coefficient of linear expansion in the direction along the board surface of the terminal board 14 and the circuit board 25 is preferably about 26.6 ppm/° C. or less. In this way, by reducing the difference in the coefficient of linear expansion of the terminal board 14 and the circuit board 25, warping of the soldered terminal board 14 and the circuit board 25 is suppressed, for example, to about 0.2 mm or less when the terminal board 14 and the circuit board 25 are soldered by a reflow process and are cooled.

Hereinafter, the principle for deriving the difference value of the coefficient of linear expansion for suppressing the warping will be described.

The temperature-average coefficient of linear expansion in the direction along the board surface of the terminal board 14 is represented by a (1/° C.) and the temperature-average coefficient of linear expansion in the direction along the board surface of the circuit board 25 is represented by b (1/° C.). Also, the temperature difference between a normal temperature (25° C.) and the melting point of solder is represented by $\Delta t$. Herein, the temperature-average coefficient of linear expansion is the average of the coefficient of linear expansion in the temperature range from the normal temperature to the melting point of solder.

In this case, attention should be paid to the direction along the board surface. First, by heating the terminal board 14 and the circuit board 25 to the melting point of solder, the terminal board 14 expands by $(1+a\Delta t)$ times compared to the state in the normal temperature and the circuit board 25 expands by $(1+b\Delta t)$ times compared to the state in the normal temperature. During a reflow process, the terminal board 14 and the circuit board 25 are soldered in this expanded state.

Figure 14A:
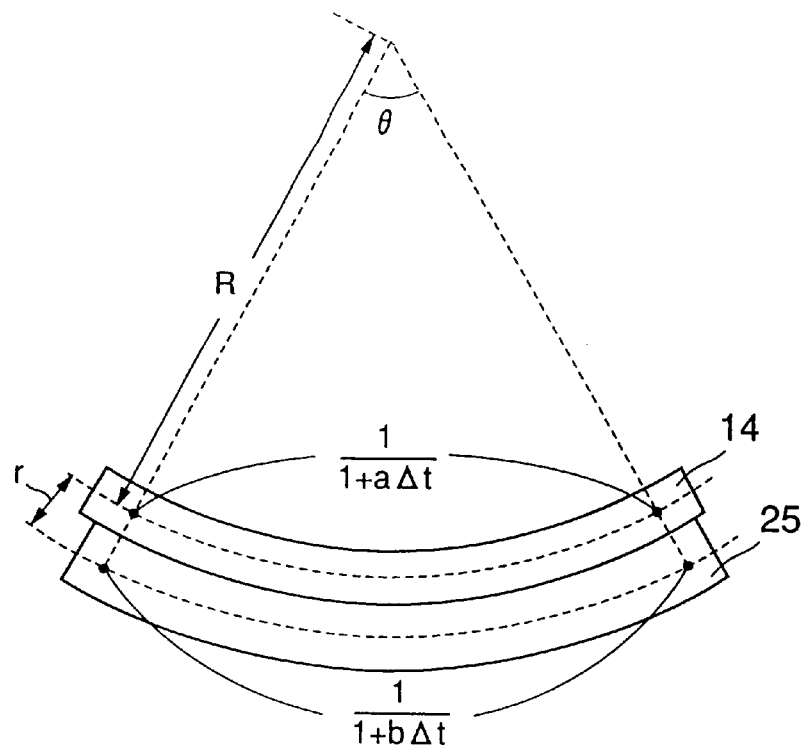
FIGS. 14A and 14B are views for illustrating a method for obtaining the condition of the coefficient of linear expansion for preventing warping of the soldered terminal board and circuit board.

After that, by cooling down the soldered terminal board 14 and the circuit board 25 to the normal temperature, the terminal board 14 shrinks to $(1/(1+a\Delta t))$ compared to the state when heating to the melting point of solder is performed, and the circuit board 25 shrinks to $(1/(1+b\Delta t))$ compared to the state when heating to the melting point of solder is performed. When the coefficient of linear expansion a of the terminal board 14 is different from the coefficient of linear expansion b of the circuit board 25, the difference in the shrinkage ratio of the terminal board 14 and the circuit board 25 is caused due to the difference in the coefficient of linear expansion. As shown in FIG. 14A, the soldered terminal board 14 and the circuit board 25 warp due to the difference in the shrinkage ratio. Incidentally, FIG. 14A shows an example of a case where the coefficient of linear expansion a of the terminal board 14 is greater than the coefficient of linear expansion b of the circuit board 25 (a>b).

Herein, if the terminal board 14 and the circuit board 25 are substantially symmetrical in the thickness direction, a uniform stress is applied to the terminal board 14 and the circuit board 25. Accordingly, the soldered terminal board 14 and the circuit board 25 warp in substantially the same curvature radius R at any position.

When the interval between the center of the terminal board 14 and the center of the circuit board 25 is represented by r and the angle formed by the length of $1/(1+a\Delta t)$ caused by the warp of the terminal board 14 is represented by $\theta$, expressions (1) and (2) are obtained.

$$2\pi R \cdot \theta/2\pi = R \cdot \theta = 1/(1+a\Delta t) \tag{1}$$

$$2\pi(R+r)\cdot\theta/2\pi = (R+r)\cdot\theta = 1/(1+b\Delta t) \tag{2}$$

By transforming expression (1), expression (3): $1/\theta = R \cdot (1+a\Delta t)$ is obtained. Also, by transforming expression (2), expression (4): $1/\theta = (R+r)\cdot(1+b\Delta t)$ is obtained. From expressions (3) and (4), expression (5) is obtained.

$$R \cdot (1+a\Delta t) = (R+r)\cdot(1+b\Delta t) \tag{5}$$

By transforming expression (5), expression (6): $R = r\cdot(1+b\Delta t)/((a-b)\cdot\Delta t)$ is obtained.

Figure 14B:
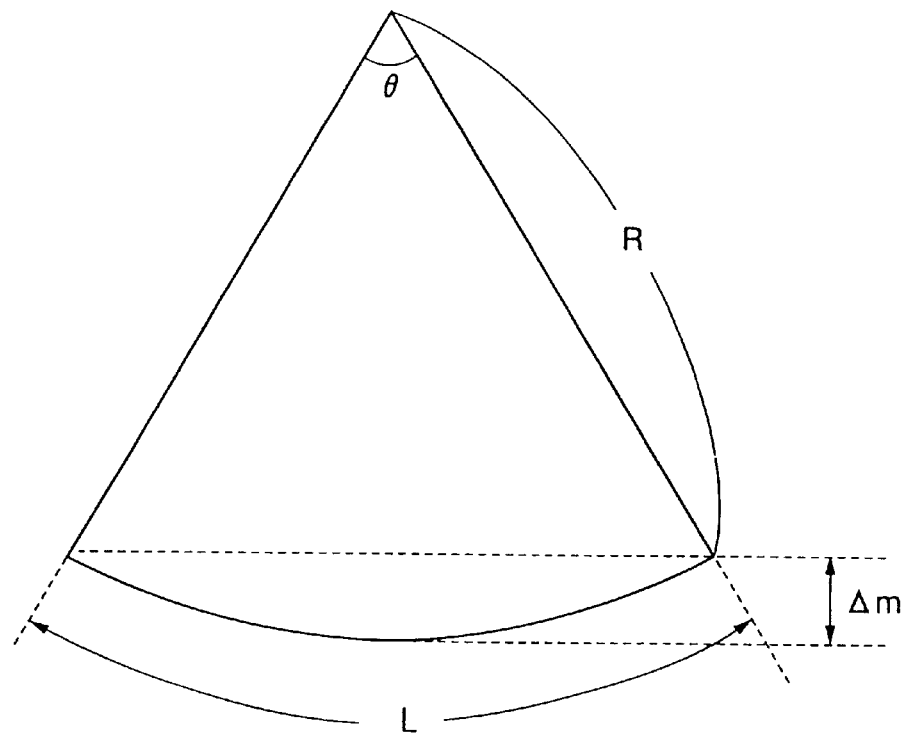

Incidentally, as shown in FIG. 14B, when the board having the length L warps in the curvature radius R such that the end portions of the board are raised by $\Delta m$ with respect to the board center, expressions (7) and (8) are obtained.

$$2\pi R \cdot \theta/2\pi = R \cdot \theta = L \tag{7}$$

$$\Delta m = R(1-\cos(\theta/2)) \tag{8}$$

By approximating expression (8) using expression (7), expression (9) is obtained.

$$\Delta m = R(1-(1+(\theta/2)2)/2!) = R \cdot L2/8R2 \tag{9}$$

By transforming expression (9), expression (10): $R = L2/8\Delta m$ is obtained.

For example, in the SD card specification, the width L of the terminal board 14 is about 20 mm. When the allowable limit of the warp of the soldered terminal board 14 and the circuit board 25 is 0.2 mm, the curvature radius R (R=202/(8×0.2)) is 250 when the warp is in the allowable limit ($\Delta m=0.2$) by expression (10). In order to set the value of the warp of the soldered terminal board 14 and the circuit board 25 to the allowable limit or less, expression (11): $R \geq 250$ is preferably satisfied.

Also, when the thickness of the terminal board 14 and that of the circuit board 25 is 1.0 mm and the thickness of solder is ignored, r is about 1.0 mm. Further, the melting point of lead solder is about 175° C. and the temperature difference Δt between the melting point and the normal temperature 25° C. is about 150° C. When lead-free solder is used, the melting point is about 190° C. and the temperature difference Δt between the melting point and the normal temperature is about 165° C.

In the case where lead solder is used, R=1.0×(1+150b)/150(a−b) is obtained from expression (6), and expression (12): 1.0×(1+150b)/150(a−b)≧250 is obtained from expression (11). By transforming expression (12), expression (13) is obtained.

$$1/(a-b) \geq (1/(1+150b)) \times 0.0375 \times 106 \quad (13)$$

In general, the coefficient of linear expansion is in the order of ppm, and thus, very small. Thus, expression (14): 1/(a−b)≧0.0375×106 is obtained by approximating expression (13), and expression (15) is obtained by transforming expression (14).

$$(a-b) \leq 26.6 \times 106 \quad (15)$$

As indicated by expression (15), the difference in the coefficient of linear expansion of the terminal board 14 and the circuit board 25 (a−b) is preferably about 26.6 ppm/° C. or less in order to suppress the warp of the soldered terminal board 14 and the circuit board 25 to about 0.2 mm or less.

Further, in order to suppress the warp of the soldered terminal board 14 and the circuit board 25 to about 0.1 mm or less, the difference in the coefficient of linear expansion of the terminal board 14 and the circuit board 25 (a−b) is preferably about 13.3 ppm/° C. or less, when the value is obtained by the same method as in the above case.

As described above, when the terminal board 14 and the circuit board 25 are made using different materials, the terminal board 14 and the circuit board 25 are preferably made using materials in which difference in the coefficient of linear expansion is very small, in order to suppress the warp of the soldered terminal board 14 and the circuit board 25.

The present invention is not limited by the first to fourth preferred embodiments and various additional embodiments may be adopted. For example, a communication card based on the specifications of an SD card is used as an example in the first to fourth preferred embodiments. However, the present invention can be applied to another type of a card-type portable device such as a memory card which is used in an information terminal device, such as a PDA.

Figure 15A:
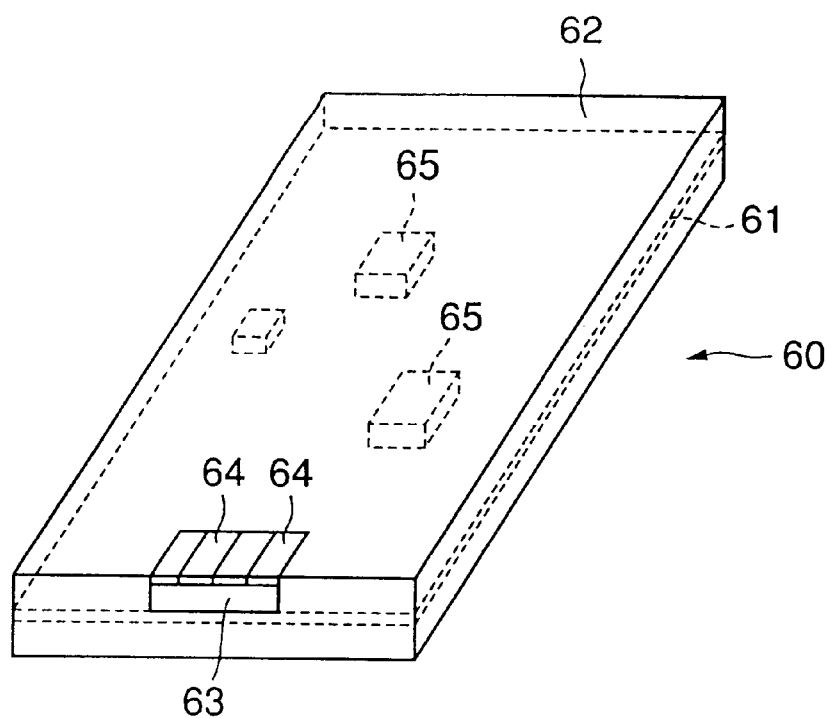
FIGS. 15A and 15B illustrate another preferred embodiment according to the present invention.
Figure 15B:
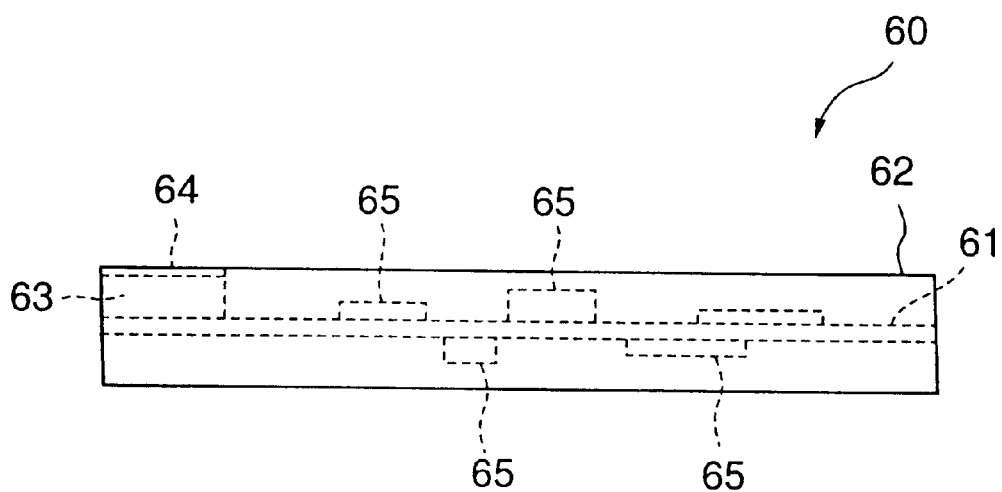
Figure 16:
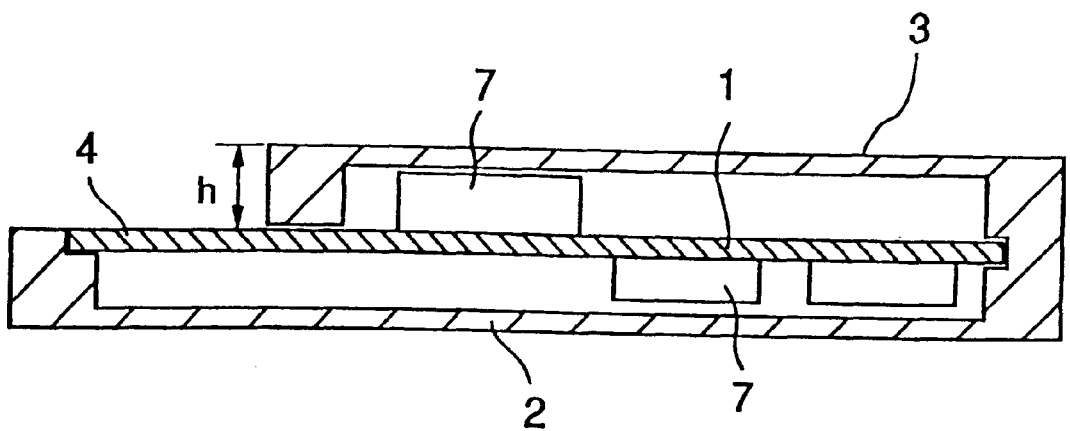
FIG. 16 is a longitudinal sectional view for illustrating a known communication card as a card-type portable device.
Figure 17:
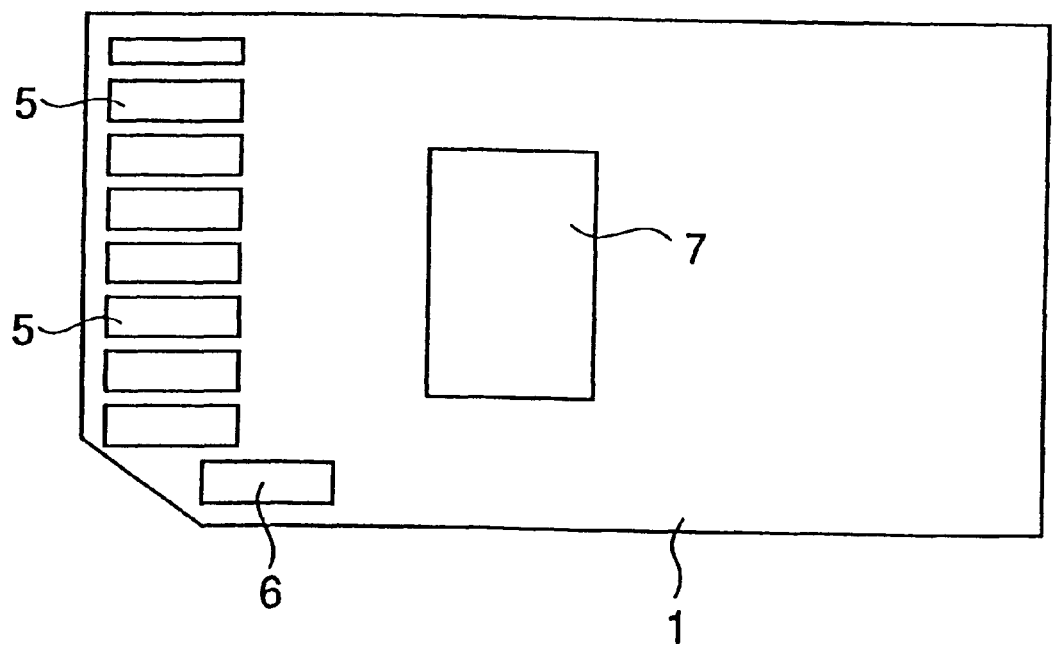
FIG. 17 is a simplified plan view of a circuit board constituting the communication card in FIG. 16.

For example, FIG. 15A is a schematic perspective view of an example of a card-type portable device according to the present invention and FIG. 15B is a schematic side view of the card-type portable device shown in FIG. 15A. In the card-type portable device 60, a circuit board 61 is accommodated in a casing 62 with a portion of the end portion being exposed. A separate terminal board 63 is mounted on the exposed portion of the circuit board 61. Terminal electrodes 64 are provided on the surface of the terminal board 63. The surface of the terminal electrodes 64 is substantially flush with the outer surface of the casing 62. In this example, electronic components 65 are provided on both surfaces of the circuit board 61.

In this configuration, the same advantages as in the above-described preferred embodiments are obtained because the terminal electrodes 64 are provided on a terminal board 63 which is separate from the circuit board 61.

Further, in the fourth preferred embodiment, the electronic components 55 provided on the bottom surface of the terminal board 14 are components for removing a disturbance noise. However, the electronic components 55 provided on the bottom surface of the terminal board 14 may be components for defining a circuit of the circuit board, and are not limited to components for removing a disturbance noise.

According to the preferred embodiments of the present invention, the terminal electrodes are not mounted on the board surface of the circuit board. Instead, the separate terminal board is provided on the circuit board and the terminal electrodes are provided on the terminal board. Accordingly, the circuit board can be freely mounted without being restricted to the specified height position of the terminal electrodes. Thus, freedom of design is greatly increased and for example, the circuit board may be arranged at a height position such that tall electronic components are easily mounted in the casing.

When the height position of the circuit board is designed in the above-described manner, since the terminal board is provided separately from the circuit board, a specified height of the terminal electrodes is ensured by appropriately selecting the thickness of the terminal board regardless of the mounting location of the circuit board. Also, the specification of the height position of the terminal electrodes includes an allowable range. In order to achieve connection with equipment such as a PDA more reliably, it is preferable that the terminal electrodes are placed in the height position of the maximum or in the vicinity of the maximum in the specification range (that is, the position closest to the outer surface). In the present invention, since the terminal electrodes are provided on the terminal board separate from the circuit board, the terminal electrodes can be arranged at the height position of the maximum or in the vicinity thereof in the specification range, without being restricted by the position of the circuit board. Accordingly, a card-type portable device which can be connected to equipment such as a PDA and which has an increased reliability is provided. Also, the terminal board can be mounted automatically on the circuit board with a mounting machine and can be defined by an ordinary printed board. Thus, the manufacturing costs are greatly reduced.

Further, since the width of the separated terminal board may be different from that of the circuit board, the width of the terminal board can be freely set regardless of the width of the circuit board. For example, the terminal board may be wider than the circuit board such that the width thereof is the same as the width of the casing. Alternatively, the terminal board may be wider than the casing such that the width of the terminal board is greater than the casing. The width of the terminal board can be designed to be greater than the width of the circuit board at a low cost. Also, since the terminal board is separate from the circuit board, the dimensional tolerance of the terminal board can be greatly improved by increasing the dimensional accuracy of only the terminal board. If the dimensional accuracy of the circuit board is increased, the cost increases because the size of the circuit board is greater than the terminal board. In the present invention, however, the dimensional accuracy of the small-sized separate terminal board can be improved without increasing the dimensional accuracy of the circuit board. Accordingly, the cost is greatly reduced and the dimensional accuracy of the portion to be connected to equipment such as a portable terminal is greatly increased, and thus, reliability in the connection is greatly increased.

Further, when the circuit board is arranged along the inner surface of one of the walls of the casing, the space for mounting the electronic components inside the casing is greatly increased, including the portion near the terminal board. Accordingly, the electronic components to be mounted on the circuit board can be freely arranged in the range of the height of the space inside the casing. Further, the height position of the terminal electrodes is freely set regardless of the height position and the thickness of the circuit board, by selecting the thickness of the terminal board. Thus, the terminal electrodes are arranged at the height position according to the specification.

In addition, when the connection electrodes are provided on the bottom surface of the terminal board and the connection patterns for coupling with the connection electrodes of the terminal board are provided on the circuit board instead of the terminal electrodes, the connection patterns of the circuit board may be made with material in which stable coupling strength with the connection electrodes of the terminal board is obtained. Also, the connection patterns need not be thickly gold-plated, as in the terminal electrodes. Accordingly, the problems caused when the terminal electrodes are provided on the circuit board, that is, the cost increases when the entire conductor portion including the wiring patterns of the circuit board is gold-plated, and gold diffuses in solder which results in deterioration in the strength of solder connection, are prevented. Additionally, the manufacturing process is simplified and the increased manufacturing costs caused by selectively gold-plating are eliminated.

Also, by providing only the terminal electrodes on the surface of the terminal board, gold-plated terminal electrodes provided without the above-described problems regarding the cost and the strength of solder connection.

Further, when the terminal electrodes and the connection electrodes of the terminal board are defined by different conductors, materials can be selected according to the functions required for the terminal electrodes and the connection electrodes. For example, the terminal electrodes may be made with metal having a small contact resistance and a high abrasion resistance. On the other hand, metal for increasing the reliability of the connection with the connection patterns of the circuit board may be used for the connection electrodes.

When each of the connection electrodes of the terminal board and each of the connection patterns of the circuit board includes a plurality of connection lands and coupling lands, the connection electrodes and the connection patterns are connected by the plurality of connection lands. If a bad connection occurs at one connection land, the electrical connection between the connection electrodes and the connection patterns is still maintained because the other connection lands are connected to each other. Accordingly, a bad connection between the connection electrodes and the connection patterns is prevented.

Also, by arranging the connection lands of the connection electrodes and the connection lands of the connection patterns to be positioned vertically facing each other when the terminal board is mounted on the circuit board, a self-alignment function is provided at a reflow area using a solder and a outstanding positioning accuracy of the terminal board with respect to the circuit board is obtained.

Further, when the connection electrodes of the terminal board and the connection patterns of the circuit board are covered with resist and the resist is provided with openings at the portions of the connection lands such that the connection lands are exposed, the connection electrode forming the surface of the terminal board and the connection pattern forming portion of the circuit board have a so-called land grid array (LGA) configuration and the terminal board can be mounted on the circuit board as an LGA component. Thus, the terminal board can be securely coupled to the circuit board. Accordingly, even when the terminal board before mounting is warped due to the formation of the terminal electrodes, the terminal electrode forming surface of the terminal board remains flat by soldering the circuit board to the terminal board.

When a solder ball is attached to each of the connection lands included in the connection electrodes of the terminal board, the terminal board has a so-called ball grid array (BGA) configuration and the terminal board can be mounted on the circuit board as a BGA component. Therefore, each of the connection electrodes of the terminal board is connected to each of the connection patterns of the circuit board at multiple connection points, and thus, a secure coupling between the terminal board and the circuit board is maintained.

When the width of the terminal board is greater than the width of the circuit board, the terminal board provided with the terminal electrode forming surface having a width which conforms with the specification can be designed at low cost, regardless of the configuration of the circuit board. Also, the width of the circuit board can be reduced to increase the strength of the casing so as to increase the strength of the device. In this case as well, the width of the terminal board can be set to conform to the required specification.

When the electronic components are placed on the bottom surface of the terminal board and the hole portions for the electronic components are provided in the terminal board mounting area of the circuit board, the area on which the electronic components are mounted is greatly increased. Additionally, by providing the electronic components for removing a disturbance noise on the bottom surface of the terminal board such that the electronic components are arranged in the conduction paths extending from the terminal electrodes to the circuit of the circuit board, a disturbance noise does not enter the circuit of the circuit board. In this case, the stability of the circuit operation is greatly increased and a card-type portable device having greatly increased reliability is provided.

When the coefficient of linear expansion in the direction along the board surface of the terminal board is substantially equal to the coefficient of linear expansion in the direction along the board surface of the circuit board, or when the difference in the coefficient of linear expansion of the terminal board and the circuit board is about 26.6 ppm/° C. or less, the shrinkage ratio of the terminal board is substantially equal to that of the circuit board when the terminal board and the circuit board are heated to be soldered and then cooled. Accordingly, warping of the soldered terminal board and circuit board, which is caused by the difference in the shrinkage ratio of the terminal board and the circuit board, is prevented.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A card-type portable device comprising:
   a circuit board for mounting electronic component to define a circuit;
   a casing for accommodating the circuit board, a portion of the circuit board being extending outside of the casing; and
   a terminal board including a surface provided with a plurality of terminal electrodes; wherein the terminal board is mounted on the circuit board, the terminal electrodes being provided at the exposed portion of the circuit board and the terminal electrodes are disposed above and spaced from an upper surface of the circuit board;

wherein the plurality of terminal electrodes electrically connected to the circuit board.

2. The card-type portable device according to claim 1, wherein the casing includes a pair of walls which face each other with a space therebetween and which are substantially parallel to each other, the circuit board is arranged along the inner surface of one of the pair of walls, a terminal electrode surface of the terminal board is arranged so as to be substantially parallel to the surface of the circuit board, and the location of the terminal electrode surface is determined based on a thickness of the terminal board.

3. The card-type portable device according to claim 1, wherein the surface of the terminal board including the plurality of terminal electrodes is a top surface, a bottom surface of the terminal board includes a plurality of connection electrodes connected to the terminal electrodes of the terminal board, and a terminal board mounting portion of the circuit board includes a plurality of connection patterns which face and are connected to the connection electrodes of the terminal board.

4. The card-type portable device according to claim 1, wherein the difference between the coefficient of linear expansion in the direction along the board surface of the terminal board and the coefficient of linear expansion in a direction along the board surface of the circuit board is about 26.6 ppm/° C. or less.

5. The card-type portable device according to claim 1, wherein the material of the terminal board and the material of the circuit board have the same coefficient of linear expansion in a direction along the board surface.

6. The card-type portable device according to claim 1, wherein the card-type portable device is a communication card having a communication function.

7. The card-type portable device according to claim 3, wherein the terminal electrodes and the connection electrodes of the terminal board are defined by different conductors.

8. The card-type portable device according to claim 3, wherein the plurality of terminal electrodes and the plurality of connection electrodes of the terminal board are aligned, the plurality of connection patterns of the circuit board is aligned with the connection electrodes of the terminal board, and the width of the terminal board in the alignment direction of the terminal electrodes is greater than the width of the circuit board in the alignment direction of the connection patterns.

9. The card-type portable device according to claim 3, wherein each of the connection electrodes of the terminal board and each of the connection patterns of the circuit board includes a plurality of connection lands and coupling lands for mutually coupling the connection lands.

10. The card-type portable device according to claim 9, wherein the connection electrodes of the terminal board and the connection patterns of the circuit board are covered with resist, the resist is provided with openings in portions of the connection land such that the connection lands are exposed, and the connection electrodes of the terminal board are the connection patterns of the circuit board facing each other are soldered.

11. The card-type portable device according to claim 13, wherein a solder ball is attached to each of the connection lands of the connection electrodes, and the connection land of the connection electrodes and the connection lands of the connection patterns facing each other are bonded via the solder balls.

12. The card-type portable device according to claim 1, wherein the electronic components are mounted on a bottom surface of the terminal board and the terminal board mounting area of the circuit board is provided with hole portions for the electronic components in portions corresponding to the electronic components.

* * * * *